United States Patent
Hill

(10) Patent No.: US 10,438,940 B2
(45) Date of Patent: Oct. 8, 2019

(54) ESD PROTECTION FOR DEPLETION-MODE DEVICES

(71) Applicant: NXP USA, Inc., Austin, TX (US)

(72) Inventor: Darrell Glenn Hill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 308 days.

(21) Appl. No.: 15/393,728

(22) Filed: Dec. 29, 2016

(65) Prior Publication Data
US 2018/0190639 A1    Jul. 5, 2018

(51) Int. Cl.
 *H02H 9/00* (2006.01)
 *H01L 27/02* (2006.01)

(52) U.S. Cl.
 CPC .................. *H01L 27/0255* (2013.01)

(58) Field of Classification Search
 USPC .......................................................... 361/56
 See application file for complete search history.

(56) References Cited

U.S. PATENT DOCUMENTS

| | | | |
|---|---|---|---|
| 7,593,204 B1 | 9/2009 | Iversen et al. | |
| 8,767,366 B2 | 7/2014 | Ping et al. | |
| 2008/0062595 A1* | 3/2008 | Ping | H01L 27/0266 361/56 |
| 2008/0080108 A1* | 4/2008 | Lin | H01L 27/0285 361/56 |
| 2014/0015591 A1* | 1/2014 | Chen | H03K 17/08104 327/380 |
| 2014/0327048 A1* | 11/2014 | Chow | H01L 27/0248 257/195 |
| 2016/0372920 A1* | 12/2016 | Kinzer | H02H 9/046 |
| 2018/0026029 A1* | 1/2018 | Lin | H01L 27/0266 361/56 |
| 2018/0190639 A1* | 7/2018 | Hill | H01L 27/027 |

* cited by examiner

*Primary Examiner* — Ronald W Leja

(57) ABSTRACT

A device includes a transistor configured for depletion-mode operation, the transistor having a gate terminal and a drain terminal, and an electrostatic discharge (ESD) protection circuit coupling the gate terminal and the drain terminal. The ESD protection circuit includes a discharge path circuit and a trigger circuit coupled to, and configured to control, the discharge path circuit. The discharge path circuit and the trigger circuit are disposed between the gate terminal and the drain terminal.

19 Claims, 3 Drawing Sheets

ESD PROTECTION FOR DEPLETION-MODE DEVICES

FIELD OF INVENTION

The present embodiments relate to semiconductor devices.

BACKGROUND

Integrated circuits (ICs) are at risk of damage due to electrostatic discharge (ESD) events. ESD events may be caused by an electrostatically charged person holding an IC chip. An ESD event may involve electrostatic potentials of 4000 Volts or more between input/output (I/O) terminals of the IC chip. During the ESD event, a discharge current flows between an I/O terminal and ground through vulnerable circuitry in the IC chip.

ESD protection devices are incorporated into IC chips across two terminals of the IC chip. ESD protection devices are often configured to protect the vulnerable circuitry by providing another path to ground for the discharge current. For example, an ESD protection device may be connected between an I/O terminal and a ground or common terminal. The ESD protection device acts as a voltage limiter to prevent the voltage between the I/O terminal and the ground terminal from reaching levels that would otherwise harm one or more transistor or other devices on the chip.

ESD protection devices are configured to remain quiescent while the voltage between the terminals falls within a normal operating range for the IC chip. When the voltage reaches a triggering voltage above that range, the ESD protection device turns on to shunt any damaging current to ground, thereby preventing damage to the IC chip. The triggering voltage of the ESD protection device should exceed the maximum normal operating voltage of the IC chip to avoid interfering with the normal operation of the IC chip.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
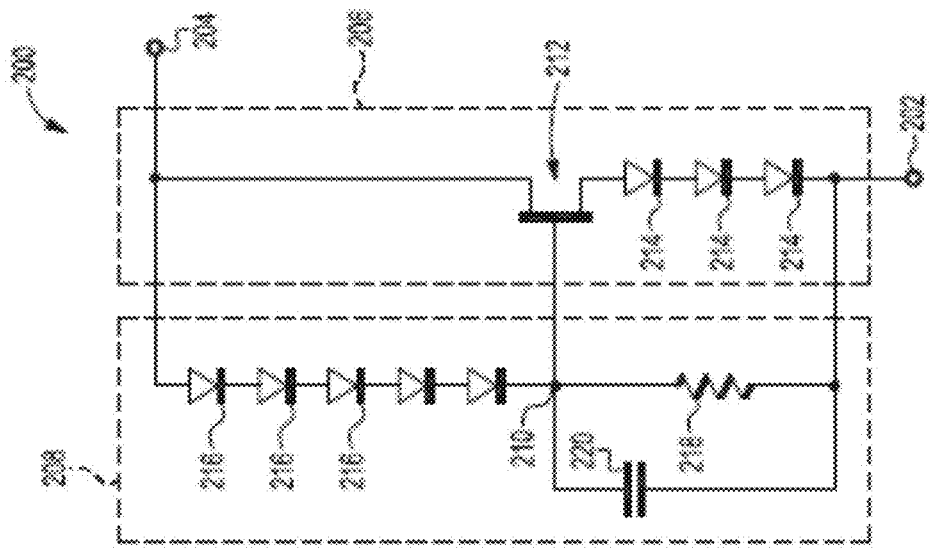
FIG. 1 is a schematic view and block diagram of a device with electrostatic discharge (ESD) protection between gate and drain terminals of a protected transistor in accordance with one embodiment.

Embodiments of devices with electrostatic discharge (ESD) protection are described, along with methods of providing ESD protection. The devices include an ESD protection circuit to protect a transistor configured for depletion-mode operation. The ESD protection circuits described herein are thus capable of improving ESD survival of normally-on, radio frequency (RF) transistors involving compound semiconductors, such as gallium nitride (GaN), gallium arsenide (GaAs), indium phosphide (InP), and other compound semiconductors. The ESD protection is provided with minimal impact on RF performance or off-state leakage current.

The ESD protection is provided for ESD events involving gate and drain terminals of the depletion-mode transistor. Disposing the ESD protection circuit between the gate and drain terminals presents challenges including, for instance, that the gate-drain pair has the largest voltage difference in normal operation. The ESD protection circuits may thus be configured to have negligible impact up to voltage levels above, for instance, about 120 Volts (V), such as in a range from about 140 V to about 150 V.

The ESD protection may be provided without relying upon a normally off switch, such as an enhancement-mode transistor. Enhancement-mode transistors may not be available in some embodiments, such as those involving compound semiconductors. The ESD protection circuits may thus include a normally-on, depletion-mode pass transistor in the discharge path. The use of a normally on, depletion-mode transistor in the discharge path presents leakage current challenges. The ESD protection circuits may accordingly include a level shifter (or level shift circuit) in the discharge path to minimize or decrease the leakage current. In some cases, the level shifter includes one or more level-shifting diodes with high current capability.

The ESD protection may be provided without relying upon a ground connection in the ESD protection circuit. As described and shown herein, the depletion-mode pass transistor and the remainder of the discharge path are disposed between the drain and gate terminals of the protected transistor. The energy of an ESD spike on the drain terminal is thus shunted to the gate terminal before dissipation to ground. In some cases, the ESD energy is shunted to ground via a Schottky gate and the substrate. Alternatively or additionally, the device includes an additional ESD protection circuit disposed between the gate terminal and a grounded source terminal of the protected transistor. In the former cases, the protected device may be an HFET device. Protected devices with an insulated gate rather than a Schottky gate (e.g., a MESFET device) may include the additional ESD protection circuit between the gate and ground.

Although described in connection with protection of GaN HFET and MESFET transistors, the ESD protection circuits described herein are useful in connection with a wide variety of transistor devices. Other types of depletion-mode transistors may be protected, including, for instance, transistors without heterojunctions, high electron mobility transistors (HEMT), and/or pseudomorphic HEMT (PHEMT), to name a few. The nature of the depletion-mode operation of the transistors may vary accordingly. Other aspects of the protected transistors may vary from the examples described and shown herein.

FIG. 1 depicts a device 100 having ESD protection in accordance with one example. The device 100 includes a transistor 102 to be protected from an ESD spike or other event (hereinafter "the protected transistor"). The protected transistor 102 has a gate terminal 104, a drain terminal 106, and a source terminal 108. In this example, the source terminal 108 is electrically floating. The energy of the ESD event may be applied to the drain terminal 106. For instance, the ESD event may involve a high voltage across the gate and drain terminals 104, 106. The ESD protection is thus provided in a manner that shunts the energy of the ESD event away from the drain-gate interface of the protected transistor 102.

The protected transistor 102 is configured for depletion-mode operation. The protected transistor 102 may be a normally on transistor. For instance, the protected transistor 102 may reside in a conductive state when the gate terminal 104 is grounded or otherwise at the same potential as the source terminal 108. In some cases, the protected transistor 102 may have a negative threshold voltage, such as about −3 Volts (V).

Various types of field effect transistor (FET) devices may be protected. In some cases, the protected transistor 102 is configured as or includes a heterostructure FET (HFET) or metal-semiconductor FET (MESFET) device. In such cases, the protected terminal 102 includes a Schottky gate or contact 110 for the gate terminal 104. Other types of high electron mobility transistor (HEMT) devices, pseudomorphic HEMT (PHEMT), and FET devices may be protected. For instance, the protected transistor 102 may have an insulated gate in which a gate oxide layer separates a polysilicon or other conductive gate electrode from the underlying substrate. Examples of such transistors include metal-insulator-semiconductor FET (MISFET) and metal-oxide-semiconductor FET (MOSFET) structures. The construction, composition, layout, configuration, and other characteristics of the gate terminal 102, including, for instance, the gate electrode, the gate-drain interface, and the gate-substrate interface, may vary accordingly.

The protected transistor 102 may be a compound-semiconductor transistor. The protected transistor 102 may be disposed or otherwise formed in and on a compound semiconductor substrate. In some cases, the semiconductor substrate includes a heterostructure configured to form a heterojunction of the protected transistor 102. For example, the semiconductor substrate may include a GaN base substrate and a number of AlGaN and other III-V semiconductor layers disposed thereon. Other types of semiconductor layers and/or materials may be used, including, for instance, GaAs substrates and InP substrates.

The device 100 includes an ESD protection circuit 112. The ESD protection circuit 112 may be connected to protect the gate-drain interface of the protected transistor 102. As shown in FIG. 1, the ESD protection circuit 112 couples the gate terminal 104 and the drain terminal 106. The ESD protection circuit 112 includes a discharge path circuit 114 and a trigger circuit 116 coupled to, and configured to control, the discharge path circuit 114. The discharge path circuit 114 and the trigger circuit 116 are disposed between the gate terminal 104 and the drain terminal 106. As shown in FIG. 1, the discharge path circuit 114 and the trigger circuit 116 have input terminals 118, 120, respectively, electrically tied to the drain terminal 106. In this case, the input terminals 118, 120 of the discharge path circuit 114 and the trigger circuit 116 are electrically tied to one another. The discharge path circuit 114 has an output terminal 122 electrically tied to the gate terminal 104. With the input and output terminals 118, 122, the discharge path circuit 114 establishes a discharge path that runs from the drain terminal 106 to the gate terminal 104. The ESD protection circuit 112 is thus capable of shunting energy of an ESD event from the drain terminal 106 to the gate terminal 104.

The trigger circuit 116 has an output terminal 124 that provides a control signal to the discharge path circuit 114. In the example of FIG. 1, the discharge path circuit 114 includes a switch 126 to which the control signal is applied or otherwise provided. The control signal is applied, or otherwise provided, to the switch 126. The control signal is thus determinative of the operational state of the switch 126.

The switch 126 may be a normally on switch. As a normally on switch, the switch 126 may toggle between multiple operational states of varying levels of conduction. For example, in one operational state, the switch 126 may be fully on (e.g, a high level of conduction for an ESD event), while in another operational state the switch may only be slightly on (e.g., a very low level of conduction for non-ESD conditions). In the latter case, the current flowing through the switch 126 is off-state leakage current.

The ESD protection circuit 112 is configured to minimize or reduce the leakage current. In the example of FIG. 1, the discharge path circuit 114 includes a level shifter 128 connected to the switch 126. The level shifter 128 is configured to establish a voltage level for a node of the switch 126 to minimize or reduce the leakage current, e.g., the current flow through the switch 126 during normal (or non-ESD) operating conditions. Shifting the voltage level (e.g., upward) effectively attempts to turn the switch 126 off as much as possible. For example, the voltage level may be shifted upward from a voltage at the gate terminal 104. Further details regarding the level shifter 128 and its effect on the switch 126 are described below.

The trigger circuit 116 may also be configured to minimize current flow during both ESD and non-ESD operating conditions. In some cases, the control signal developed by the trigger circuit 116 may be a voltage signal. The voltage signal may be generated by the trigger circuit 116 in response to the voltage of the ESD event. For example, the trigger circuit 116 may be configured to operate as a voltage divider such that the control signal corresponds with a fraction of the ESD event voltage. The trigger circuit 116 may accordingly include a high resistance current path between the drain terminal 106 and the gate terminal 104. In contrast, the constituent elements of the discharge path circuit 114 (e.g., the switch 126 and the level shifter 128) are configured to provide a much lower resistance current path between the drain terminal 106 and the gate terminal 104 when discharging the energy of an ESD event.

In operation, once the trigger circuit 116 senses or detects a voltage level at the drain terminal 106 at or higher than a trigger voltage level of the trigger circuit 116, the ESD protection circuit 112 is configured to switch from a quiescent state to an ESD protection state. The trigger circuit 116 is configured to establish the trigger voltage level. In some cases, the trigger voltage level is about 120 V or higher—e.g., a level well above the normal operating range of voltages experienced between the gate and drain terminals 104, 106.

The energy of an ESD event involving the drain-gate terminal pair may in certain cases be eventually shunted to the source terminal 108 or ground. In such cases, after the ESD energy is shunted to the gate terminal 104 as described above, the voltage level of the gate terminal 104 changes to a level sufficient to cause a Schottky gate to conduct current to the source terminal 108 or ground and/or activate another ESD protection circuit coupled to the source terminal 108 or ground. Examples having a compound semiconductor substrate (e.g., GaN and other III-V substrates) may be configured with such Schottky gates.

Figure 2:
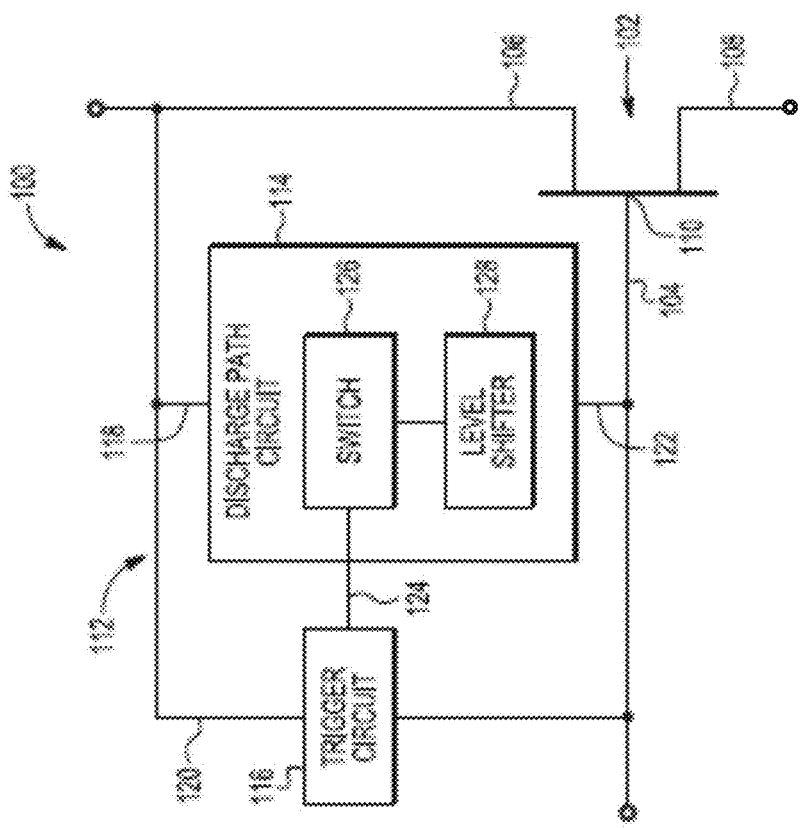
FIG. 2 is a schematic view of an ESD protection circuit of the device of FIG. 1 in accordance with one embodiment.

FIG. 2 depicts a ESD protection circuit 200 in accordance with one example. The ESD protection circuit 200 may be used as the ESD protection circuit 112 in the device 100 of FIG. 1. The ESD protection circuit 200 is thus configured to protect a gate-drain interface of a depletion-mode transistor, as described above. For instance, the ESD protection circuit 200 includes a pair of terminals 202, 204 that may be electrically tied to the gate and drain terminals 104, 106 of the protected device 102 of FIG. 1. The terminal 202 is accordingly referenced as the gate terminal 202, and the terminal 204 is accordingly referenced as the drain terminal 204.

The ESD protection circuit 200 includes a discharge path circuit 206 and a trigger circuit 208. Both the discharge path circuit 206 and the trigger circuit 208 are disposed between, and connected to, the gate and drain terminals 202, 204. In this example, the discharge path circuit 206 and the trigger circuit 208 are connected in parallel between the gate and drain terminals 202, 204, with the exception of a node 210 at which the circuits 206, 208 are connected to one another. The node 210 corresponds with the location at which the control signal developed by the trigger circuit 208 is provided to the discharge path circuit 206 (e.g., output terminal 124, FIG. 1).

The discharge path circuit 206 includes a pass transistor 212. The pass transistor 212 acts as the switch 126 described above in connection with FIG. 1. In the example of FIG. 2, the pass transistor 212 is a depletion-mode transistor. The pass transistor 212 may thus be formed with the same fabrication processes used to form the depletion-mode transistor to be protected (e.g., transistor 102, FIG. 1). For instance, the pass transistor 212 and the protected transistor may thus be disposed in and on a common die, which may include a compound semiconductor substrate. An example of a common die is described and shown in connection with FIG. 3.

The activation (e.g., full conduction) of the pass transistor 212 establishes the discharge path of the ESD protection circuit 200. In the example of FIG. 2, the drain terminal of the pass transistor 212 is electrically tied to the drain terminal 204. The drain terminal of the pass transistor 212 may thus be tied to the drain terminal of the protected transistor. The gate terminal of the pass transistor 212 is coupled to the gate and drain terminals 202, 204 by the trigger circuit 208. In this case, the gate terminal of the pass transistor 212 corresponds with the node 210. In other cases, the terminals of the pass transistor 212 are connected or coupled to the gate and drain terminals 202, 204 via additional or alternative circuit elements. For example, one or more elements (e.g., resistive elements) may be disposed between the node 210 and the gate terminal of the pass transistor 212.

The pass transistor 212 may be configured with a Schottky gate. For example, the pass transistor 212 may be a heterojunction FET (HFET). Other types of transistors may be used, including, for instance, other types of depletion-mode transistors, such as other HEMT devices. The construction, configuration, composition, and other characteristics of the gate electrode of the pass transistor may vary accordingly.

The discharge path circuit 206 includes a number of level-shift diodes 214. In the example shown, three level-shift diodes 214 are provided. The level-shift diodes 214 are disposed in a series or stack arrangement. In this example, the series arrangement couples the source terminal of the pass transistor 212 to the gate terminal 202. The level-shift diodes 214 are connected to the gate terminal 202 and oriented to establish a voltage level for the discharge path circuit 206 shifted upward from a voltage at the gate terminal 202. In this example, the voltage level corresponds with the source voltage level for the pass transistor 212. By raising the source voltage level, the gate-source voltage for the pass transistor 212 is lowered (e.g., more negative). With a lower gate-source voltage, the extent to which the pass transistor 212 is activated (e.g., ON) and conductive during quiescent periods of operation (e.g., non-ESD event operation) is decreased. As a result, off-state leakage current during quiescent periods is reduced. Leakage current levels below, for instance, 1 milliAmp (mA) may be achieved. For example, with three or more level-shift diodes 214 the leakage current may be less than about 0.1 mA.

Each level-shift diode 214 may introduce a voltage drop of about 1 V to about 2 V depending on, e.g., the fabrication process technology. In one embodiment, three diodes may be used. The three level-shift diodes 214 may thus shift the source voltage level upward by about 3 V to about 6 V relative to, e.g., the voltage of the gate terminal 202, e.g., the gate terminal 104 of the protected transistor 102 (FIG. 1).

The level-shift diodes 214 may be configured to accommodate high current levels. A high current capacity may be useful in shunting the energy of an ESD event effectively without, for instance, undesirable levels of resistance. Each level-shift diodes 214 may accordingly have a much larger device area than, for instance, other diodes in the ESD protection circuit 200, such as the trigger diodes described below. For example, the level-shift diodes 214 may be more than twenty times larger than the trigger diodes.

In some cases, the level-shift diodes 214 are Schottky diodes. For instance, Schottky diodes may be used in GaN, GaAs, InP and other III-V compound semiconductor examples. In such cases, the metal electrode of the level-shift diodes 214 may be formed via the same processes used to fabricate the gate electrode of the pass transistor 212. The diode and gate electrodes may thus be configured similarly.

The number of level-shift diodes 214 affects the extent to which the off-state leakage current is reduced. A lower leakage current is realized at the expense of either additional device area consumed by the level-shift diodes 214 and/or increased die size. The number of level-shift diodes 214 may thus vary in accordance with that tradeoff. For example, a lower number of level-shift diodes 214 may be used if leakage current is not as critical as the marginal increase in device area. In some cases, a single level-shift diode 214 may be used. In other cases, more than three level-shift diodes 214 are used when, for instance, the consumption of additional area is not problematic.

In one embodiment, the trigger circuit 208 includes a number of trigger diodes 216. The trigger diodes 216 are disposed in a series or stack arrangement between the drain terminal 204 and the connection to the discharge path circuit 206, and with their respective anodes oriented toward the drain terminal 204 and their cathodes oriented toward the gate terminal 202. The trigger diodes 216 are thus disposed to sense or detect the voltage of an ESD event involving the drain terminal 204. Selecting the number of trigger diodes 216 in the stack sets or establishes the trigger voltage of the trigger circuit 208. The voltage at which the ESD protection circuit 200 is activated to shunt energy from the drain terminal 204 to the gate terminal 202 may be adjusted by changing the number of trigger diodes 216 and/or the voltage drop characteristic for each trigger diode 216.

The trigger diodes 216 are oriented for forward-bias conduction when triggering activation of the discharge path circuit 206 as a result of the ESD event. The conduction of the trigger diodes 216 develops a control signal for the discharge path circuit 206. When the ESD event voltage is present, the trigger diodes 216 are switched to a forward conduction mode, thereby passing a portion of the ESD event voltage as the control signal. In the example of FIG.

2, one end of the series arrangement of the trigger diodes 216 is electrically tied to the drain terminal 204, while the other end of the series arrangement of the trigger diodes 216 is electrically tied to the node 210. In this case, the trigger circuit 208 also includes a resistor 218 disposed between the node 210 and the gate terminal 202. The resistor 218 establishes a voltage divider to develop the control signal at the node 210.

In operation, an ESD event voltage is high enough to cause all of the trigger diodes 216 to become forward biased. The resistor 218 is large enough such that only a small current flows, while still raising the voltage of the node 210 to a level sufficient to activate (e.g., fully activate) the pass transistor 212. The configuration of the voltage divider and other aspects of the trigger circuit 208 may vary from the example shown. For example, additional resistance may be disposed between the trigger diodes 216 and the node 210 to lower the voltage applied to the gate of the pass transistor 212. In another embodiment, some or all of the trigger diodes 216 may be replaced by a resistor which, together with resistor 218, establishes a voltage divider to develop the control signal at the node 210. In yet another embodiment, some or all of the trigger diodes 216 may be replaced by one or more diodes with reversed orientation, such that their respective cathodes are oriented toward the drain terminal 204 and their anodes are oriented toward the gate terminal 202. In this embodiment, a diode with reversed orientation conducts relatively little current unless the voltage difference between its anode and cathode exceeds the reverse breakdown voltage of the diode. Thus, the breakdown voltage of the reversed-orientation diode (rather than its forward turn-on voltage) contributes to the establishment of the trigger voltage of the trigger circuit. In other embodiments, the trigger circuit may use a combination of diodes with both orientations.

The number of trigger diodes 216 in the stack nay vary considerably. Indeed, the schematic view of FIG. 2 is not necessarily representative of the number of trigger diodes 216 involved in many applications. The number of trigger diodes 216 is determinative of a trigger voltage level at which the ESD protection circuit 200 begins to pass current through the discharge path. The voltage level may thus be higher (e.g., significantly higher) than the expected range of operating voltages at the drain terminal 204. For example, the number of trigger diodes 216 may be as low as three diodes 216 (in either orientation) or may exceed 50 or 75 diodes (e.g., 53 or 60 diodes) so that the trigger voltage level is above about 120 V. The trigger voltage level and, thus, the number of trigger diodes 216, may vary with, e.g., application or other usage context.

In some cases, an excess number of trigger diodes 216 may be included to provide tunability and/or excess voltage margin. For example, a die on which the ESD protection circuit 200 is disposed may be configured to accommodate a variety of applications and usage scenarios. A desired number of trigger diodes 216 may then be selected via a change in the layout of one or more metal layers and conductive vias.

The configuration of the ESD protection circuit 200 may vary. For instance, in the example of FIG. 2, the trigger circuit 208 also includes a capacitor 220 connected in parallel with the resistor 218. In this case, the capacitor 220 is connected between the node 210 and the gate terminal 202. The capacitor 220 may be configured to provide operational stability during an ESD event. For instance, an ESD event having more than one pulse and/or a varying pulse may present voltages that fall below the trigger threshold for a brief period of time. The capacitor 220 may be configured to prevent oscillation of the ESD protection circuit 200 between conductive and non-conductive states in connection with such transient changes in the ESD voltage level. In other cases, the ESD protection circuit 200 does not include the capacitor 220 or includes additional capacitances to smooth or filter one or more other voltage levels during transient conditions.

Figure 3:
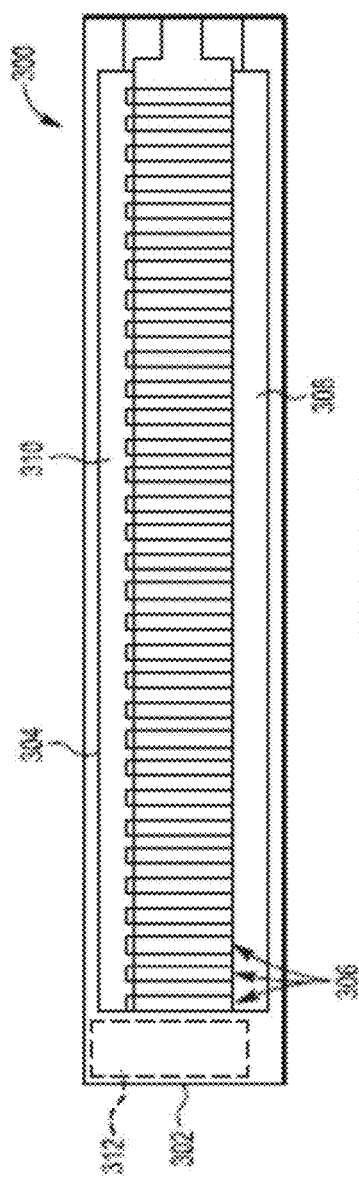
FIG. 3 is a plan view of an ESD protection circuit of the device of FIG. 1 in accordance with one embodiment.

FIG. 3 depicts a plan view of a device 300 with ESD protection in accordance with one example. The plan view shows the layout of the device 300 on a die 302. The die 302 and, thus, the device 300 includes a semiconductor substrate 304 in and on which the above-described circuit elements are disposed and formed. In some cases, the semiconductor substrate is composed of or otherwise includes a compound semiconductor, such as GaN, GaAs, InP, and other III-V semiconductor materials.

The semiconductor substrate 304 is diced to form the die 302. In the example of FIG. 3, the die 302 has an elongate shape to accommodate a number of transistor structures 306 connected in parallel to form the transistor to be protected. Each transistor structure 306 extends between a common gate electrode or terminal 308 and a common drain electrode or terminal 310. The common gate and drain electrodes 308, 310 extend along the length of the die 302. Each transistor structure 306 is thus oriented transversely to the length dimension of the die 302.

Each transistor structure 306 includes a respective gate structure electrically connected to the common gate electrode or terminal 308. Each transistor structure 306 also includes a drain region. Each drain region is electrically connected to the common drain electrode 310. Adjacent structures of the transistor structures 306 may share a source region or a drain region as shown. The aspect ratio of the die 302 may vary considerably from the example shown.

In the example of FIG. 3, an ESD protection circuit 312 of the device 300 is provided at one end of the die 302. In an alternate embodiment, another instantiation of an ESD protection circuit also may be provided at the other end of the die 302. The ESD protection circuit 312 may include the elements and be otherwise configured as described above. The diode stacks or arrangements, pass transistor, and other elements may thus be provided without consuming much die area. For instance, the ESD protection 312 may fit within the area that may be otherwise occupied by a stitch pad or other peripheral device component.

The ESD protection provided by the above-described ESD protection circuits is not bi-directional. The ESD protection circuits are capable of shunting energy of ESD events involving a high, positive voltage at the drain of the transistor to be protected. In contrast, ESD events involving the opposite or reverse polarity—e.g., a high, positive voltage at the gate of the transistor to be protected—are not handled by the ESD protection circuits. However, the transistor may nonetheless survive such reverse ESD events. For instance, the energy of a reverse ESD event may be shunted to ground via the substrate in cases having a transistor with a Schottky gate. A high, positive voltage on the gate terminal forward biases the Schottky diode at the gate-substrate interface.

The above-described devices may have one or more ESD protection circuits in addition to an ESD protection circuits configured in accordance with the examples described above. The additional ESD protection circuits may be disposed between terminal pairs other than the drain-gate terminal pair protected as described above.

Figure 4:
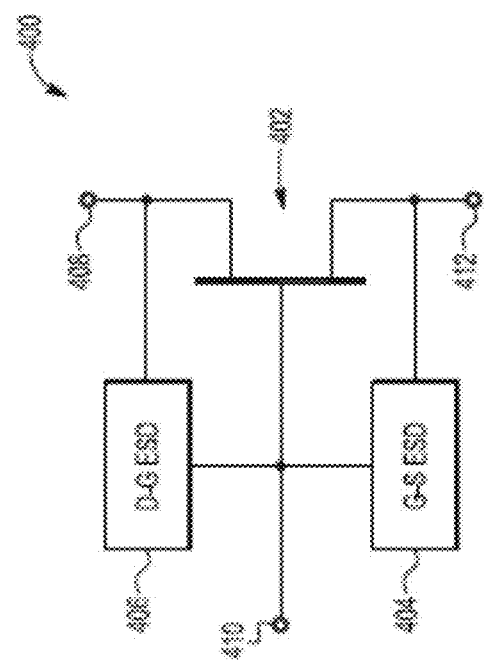
FIG. 4 is a schematic view and block diagram of a device with electrostatic discharge (ESD) protection between multiple terminal pairs in accordance with one embodiment.

FIG. 4 depicts an example of a device 400 having a transistor 402 protected by an ESD protection circuit 404 as well as an ESD protection circuit 406. The ESD protection circuit 406 is disposed and configured as described above. For instance, the ESD protection circuit 404 is disposed between a drain terminal 408 and a gate terminal 410 to protect the gate-drain interface of the transistor 402 from ESD events involving high voltages occurring at the drain terminal 408.

The ESD protection circuit 404 is provided to protect the transistor 402 from ESD energy present at terminals other than the drain terminal 408. For instance, the ESD protection circuit 404 may be directed to handling the ESD energy shunted from the drain terminal 408 to the gate terminal 410 by the other ESD protection circuit 406. The ESD protection circuit 404 may alternatively or additionally be directed to handling ESD events originating on the gate terminal 410. To these ends, the ESD protection circuit 404 is disposed between the gate terminal 410 of the transistor 402 and a source terminal 412 of the transistor 402. The source terminal 412 may be floating or grounded.

The ESD protection circuit 404 may include a diode stack and/or other circuit to shunt the ESD energy from the gate terminal 410 to the source terminal 412. The components, configuration, and other characteristics of the ESD protection circuit 404 may vary. For instance, the ESD protection circuit 404 may include a pass transistor configured and triggered similarly to those in the examples described above.

Other combinations of the various features and aspects of the embodiments described above may also be provided. For example, one or more features or aspects of one embodiment may be combined with one or more features or aspects of another embodiment, even though the resulting combination is not expressly described or identically shown in the figures.

Figure 5:
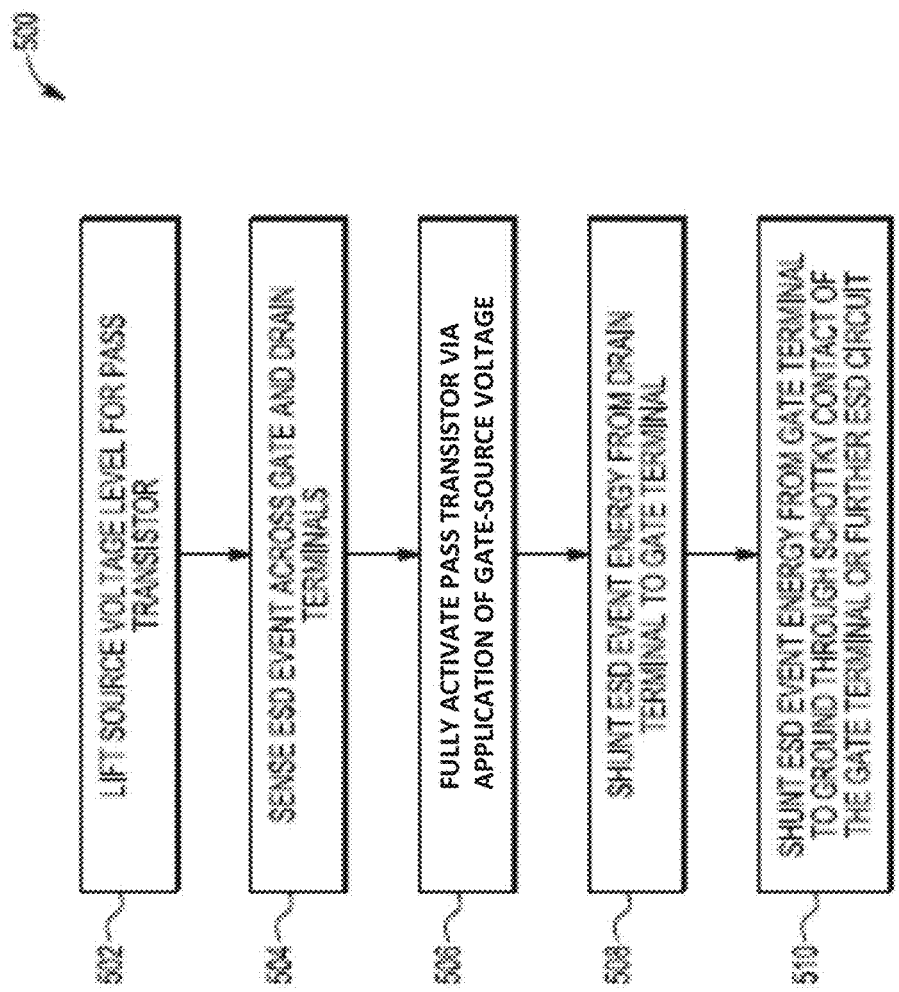
FIG. 5 is a flow diagram of a method of providing ESD protection in accordance with one embodiment.

FIG. 5 shows an exemplary method 500 for providing ESD protection for a depletion-mode transistor. The method may be implemented using one or more of the above-described ESD protection circuits. The method includes a sequence of acts, only the salient of which are depicted for convenience in illustration.

The method 500 may begin with one or more acts directed to connecting or otherwise providing an ESD protection circuit configured as described above. In some cases, however, the ESD protection circuit is already connected as an integrated component of a monolithic device including the transistor to be protected. In other cases, one or more electrical connections may be made to dispose the ESD protection circuit between the gate and drain terminals of the transistor to be protected, as described above.

In the example of FIG. 5, the method 500 includes an act 502 in which a source voltage level is lifted for a depletion-mode pass transistor of an ESD protection circuit. The voltage level may be lifted via one or more diodes disposed in a discharge path in series with the pass transistor. Each diode is oriented and configured to introduce a voltage differential between the gate terminal of the protected device and the source terminal of the pass transistor. The source voltage level of the pass transistor is thus shifted upward from the voltage level at the gate terminal of the protected transistor. Each diode may thus be considered a level-shift diode. The upward shift of the source voltage level reduces the extent to which the pass transistor is conducting during normal (non-ESD event) operation. Off-state leakage current is thereby reduced or minimized. The act 502 may be omitted in other cases, such as those not involving a depletion-mode pass transistor.

In act 504, an ESD event is sensed or detected across the gate and drain terminals of the protected transistor. As described above, the ESD protection circuit includes a trigger circuit disposed between the drain and gate terminals and configured to detect or sense an ESD event having a drain-gate voltage above a trigger threshold. Once that occurs, the act 504 may include the trigger circuit generating a control signal to activate (e.g., fully activate) the pass transistor.

In the example of FIG. 5, the activation of the pass transistor is implemented in an act 506. The act 506 includes the application of the gate-source voltage of the protected transistor, or at least a portion thereof, to the gate of the pass transistor. For instance, and as described above, the trigger circuit may include a stack of trigger diodes disposed in a voltage divider so that a portion of the gate-drain voltage of the protected transistor is applied to the gate of the pass transistor.

With the pass transistor activated (e.g., fully activated), current flow via the discharge path is possible. The energy of the ESD event is therefore shunted in an act 508 from the drain terminal to the gate terminal of the protected transistor. For example, the ESD event energy may be shunted from the drain terminal to the gate terminal via a discharge path circuit controlled by the trigger circuit. As described above, the discharge path circuit may provide a discharge path between the drain terminal and the gate terminal of the protected transistor. The discharge path may include a pass transistor and one or more level-shift diodes, as also described above.

The method 500 may also include an act 510 in which the ESD event energy is also shunted from the gate terminal to, for instance, ground. In some cases, such additional shunting is provided by another ESD protection circuit disposed between, for instance, the gate and source terminals of the protected transistor. Alternatively or additionally, the shunting is provided via a Schottky interface between the gate electrode of the gate terminal and the source terminal.

The ordering of the acts may vary in other embodiments. For example, an act directed to lifting a source terminal voltage of a pass transistor may be implemented both before and after one or more acts involving the dissipation of ESD event energy.

Additional, fewer, or alternative acts may be implemented. For example, the ESD energy may be dissipated once the energy reaches the gate terminal of the protected transistor without shunting the energy to ground. Current flow through the substrate or an additional ESD protection circuit may thus not be necessary. For instance, another path for the ESD energy may exist in the device.

Described above are monolithic ESD protection circuits configured to protect the gate-drain terminal pair of depletion-mode transistors, such as GaN, GaAs, and/or InP transistors and other RF power devices. The ESD protection is provided while achieving low leakage current under normal operation. Sufficient ESD protection is also achieved despite the disposition of diodes in the discharge path. The diodes are directed to shifting a voltage level of a depletion-mode pass transistor in the discharge path that would otherwise conduct significant current during normal (non-ESD event) operation. The footprint of the disclosed ESD protection circuits is modest such that the ESD protection is also achieved without significant adverse impact on die size.

Although described as useful in connection with RF power devices, the disclosed devices may be useful in a variety of other applications. The devices are not limited to any particular application or type of load.

In a first aspect, a device includes a transistor configured for depletion-mode operation, the transistor having a gate terminal and a drain terminal, and an ESD protection circuit coupling the gate terminal and the drain terminal, the ESD protection circuit including a discharge path circuit and a trigger circuit coupled to, and configured to control, the discharge path circuit. The discharge path circuit and the trigger circuit are disposed between the gate terminal and the drain terminal.

In a second aspect, a device includes a transistor configured for depletion-mode operation, the transistor having a gate terminal and a drain terminal, and an ESD protection circuit coupling the gate terminal and the drain terminal, the ESD protection circuit including a pass transistor and a trigger circuit configured to activate the pass transistor upon an ESD event on the drain terminal. The pass transistor is configured for depletion-mode operation. The pass transistor and the trigger circuit are disposed between the gate terminal and the drain terminal.

In a third aspect, a method of providing ESD protection for a depletion-mode transistor includes sensing, via a trigger circuit, an ESD event having an ESD voltage across a drain terminal of the depletion-mode transistor and a gate terminal of the depletion-mode transistor, the trigger circuit being disposed between the drain terminal and the gate terminal, and shunting energy of the ESD event from the drain terminal to the gate terminal via a discharge path circuit controlled by the trigger circuit, the discharge path circuit providing a discharge path between the drain terminal and the gate terminal.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and FET are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
a transistor configured for depletion-mode operation, the transistor having a gate terminal and a drain terminal; and
an electrostatic discharge (ESD) protection circuit coupling the gate terminal and the drain terminal, the ESD protection circuit comprising a discharge path circuit and a trigger circuit coupled to, and configured to control, the discharge path circuit;
wherein the discharge path circuit and the trigger circuit are disposed between the gate terminal and the drain terminal; and
wherein the discharge path circuit comprises a normally-on transistor and a level shifter coupled to a source of the normally-on transistor.

2. The device of claim 1, wherein the normally-on transistor comprises a depletion-mode pass transistor.

3. The device of claim 2, wherein the depletion-mode pass transistor of the discharge path circuit has a drain terminal tied to the drain terminal of the transistor.

4. The device of claim 2, wherein the depletion-mode pass transistor of the discharge path circuit has a gate terminal coupled to the drain and gate terminals of the transistor by the trigger circuit.

5. The device of claim 2, wherein the depletion-mode pass transistor comprises a Schottky gate.

6. The device of claim 1, wherein the trigger circuit comprises a plurality of diodes disposed in a series arrangement.

7. The device of claim 6, wherein the plurality of diodes are oriented for forward-bias conduction when triggering activation of the discharge path circuit.

8. The device of claim 6, wherein the series arrangement of the plurality of diodes is configured to establish a trigger voltage level above about 120 Volts.

9. The device of claim 6, wherein at least one of the plurality of diodes is oriented for reverse-bias conduction when triggering activation of the discharge path circuit.

10. The device of claim 1, wherein the level shifter comprises a level-shift diode connected to the gate terminal of the transistor and oriented to establish a voltage level for the source of the normally-on transistor shifted upward from a voltage at the gate terminal.

11. The device of claim 1, wherein the transistor comprises a Schottky gate.

12. The device of claim 1, further comprising a further ESD protection circuit disposed between the gate terminal of the transistor and a source terminal of the transistor.

13. The device of claim 1, further comprising a compound semiconductor substrate in which the transistor is disposed.

14. The device of claim 13, wherein:
the compound semiconductor substrate is configured as an elongate die; and
the ESD protection circuit is disposed at an end of the elongate die.

15. The device of claim 1, wherein the transistor has a source terminal tied to ground.

16. A device comprising:
a transistor configured for depletion-mode operation, the transistor having a gate terminal and a drain terminal; and
an electrostatic discharge (ESD) protection circuit coupling the gate terminal and the drain terminal, the ESD protection circuit comprising a pass transistor and a trigger circuit configured to activate the pass transistor upon an ESD event on the drain terminal;
wherein:
the pass transistor is configured for depletion-mode operation;
the pass transistor and the trigger circuit are disposed between the gate terminal and the drain terminal; and
a discharge path circuit comprises a level-shifting diode connected to a source of the pass transistor and gate terminal of the transistor and oriented to establish a voltage level for the source of the pass transistor shifted upward from a voltage at the gate terminal.

17. The device of claim 16, wherein:
the trigger circuit comprises a plurality of diodes disposed in a series arrangement; and
at least one of the plurality of diodes is oriented for reverse-bias conduction when triggering activation of the discharge path circuit.

18. A method of providing electrostatic discharge (ESD) protection for a depletion-mode transistor, the method comprising:
sensing, via a trigger circuit, an ESD event having an ESD voltage across a drain terminal of the depletion-mode transistor and a gate terminal of the depletion-mode transistor, wherein the trigger circuit is disposed between the drain terminal and the gate terminal; and
shunting energy of the ESD event from the drain terminal to the gate terminal via a discharge path circuit controlled by the trigger circuit, the discharge path circuit providing a discharge path between the drain terminal and the gate terminal, wherein the discharge path circuit comprises a normally-on switch and a level shifting diode connected to the normally-on switch.

19. The method of claim 18, further comprising shunting the energy of the ESD event from the gate terminal to ground through a Schottky contact of the gate terminal.

* * * * *